(12) United States Patent
Peng

(10) Patent No.: US 12,259,417 B2
(45) Date of Patent: *Mar. 25, 2025

(54) SYSTEM AND METHOD OF MEASURING FUSE RESISTANCE AND NON-TRANSITORY COMPUTER READABLE MEDIUM

(71) Applicant: NANYA TECHNOLOGY CORPORATION, New Taipei (TW)

(72) Inventor: Mei Chuan Peng, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/407,477

(22) Filed: Jan. 9, 2024

(65) Prior Publication Data

US 2024/0151756 A1    May 9, 2024

Related U.S. Application Data

(63) Continuation of application No. 17/643,184, filed on Dec. 8, 2021, now Pat. No. 11,906,560.

(51) Int. Cl.
| | | |
|---|---|---|
| *G01R 27/08* | (2006.01) | |
| *G01R 27/14* | (2006.01) | |
| *G01R 31/52* | (2020.01) | |
| *G01R 31/74* | (2020.01) | |

(52) U.S. Cl.
CPC .............. *G01R 27/08* (2013.01); *G01R 31/74* (2020.01); *G01R 27/14* (2013.01); *G01R 31/52* (2020.01)

(58) Field of Classification Search
CPC ........ G01R 27/00; G01R 27/02; G01R 27/08; G01R 31/00; G01R 31/50; G01R 31/52; G01R 31/74; G01R 27/14
USPC ................................. 324/600, 649, 691, 722
See application file for complete search history.

(56) References Cited

U.S. PATENT DOCUMENTS

| | | |
|---|---|---|
| 10,161,976 B2 | 12/2018 | Chou et al. |
| 11,906,560 B2 * | 2/2024 | Peng ...................... G01R 31/74 |
| 2002/0163343 A1 | 11/2002 | Damon et al. |
| 2002/0167323 A1 | 11/2002 | Khoury |
| 2005/0247997 A1 | 11/2005 | Chung et al. |

FOREIGN PATENT DOCUMENTS

| | | | |
|---|---|---|---|
| CA | 2916889 C | 4/2021 | |
| CN | 113765205 A | 12/2021 | |
| EP | 4375676 A1 * | 5/2024 | ............... G01R 1/04 |

* cited by examiner

*Primary Examiner* — Hoai-An D. Nguyen
(74) *Attorney, Agent, or Firm* — CKC & Partners Co., LLC

(57) ABSTRACT

A method of measuring a fuse resistance includes steps as follows. A predetermined voltage value of a force voltage on a common ground (CGND) bus electrically connected to at least one fuse element, a first current value of a measured current through the CGND bus in a first condition, and a second current value of another measured current through the CGND bus in a second condition are preloaded. The second current value is subtracted from the first current value, so as to get a subtracted current value, thereby removing a value of a leakage current through the CGND bus. The predetermined voltage value is divided by the subtracted current value to equal the fuse resistance of the at least one fuse element.

20 Claims, 3 Drawing Sheets

SYSTEM AND METHOD OF MEASURING FUSE RESISTANCE AND NON-TRANSITORY COMPUTER READABLE MEDIUM

CROSS-REFERENCE TO RELATED APPLICATION(S)

This application is a continuation application of U.S. application Ser. No. 17/643,184, filed on Dec. 8, 2021, which is herein incorporated by reference.

BACKGROUND

Field of Invention

The present invention relates to systems and methods, and more particularly, systems and methods of measuring fuse resistances.

Description of Related Art

Nowadays, a conventional manner of forcing one voltage and measuring one current is a merely method to know approaching fuse resistance. However, the value of this fuse resistance is incorrect through aforesaid method.

In view of the foregoing, there still exist some problems on the incorrect fuse resistance measuring that await further improvement. However, those skilled in the art sought vainly for a solution. Accordingly, there is an urgent need in the related field to solve or circumvent above problems and disadvantages.

SUMMARY

The following presents a simplified summary of the disclosure in order to provide a basic understanding to the reader. This summary is not an extensive overview of the disclosure and it does not identify key/critical components of the present invention or delineate the scope of the present invention. Its sole purpose is to present some concepts disclosed herein in a simplified form as a prelude to the more detailed description that is presented later.

According to embodiments of the present disclosure, the present disclosure provides systems and methods of measuring fuse resistances, to solve or circumvent aforesaid problems and disadvantages in the related art.

An embodiment of the present disclosure is related to a system of measuring a fuse resistance, and the system includes a storage device and a processor. The storage device is configured to store a predetermined voltage value of a force voltage on a common ground (CGND) bus electrically connected to at least one fuse element, a first current value of a measured current through the CGND bus in a first condition, a second current value of another measured current through the CGND bus in a second condition, and at least one instruction. The processor is electrically connected to the storage device and is configured to access and execute the at least one instruction for: subtracting the second current value from the first current value, so as to get a subtracted current value, thereby removing a value of a leakage current through the CGND bus; dividing the predetermined voltage value by the subtracted current value to equal the fuse resistance of the at least one fuse element.

Another embodiment of the present disclosure is related to a method of measuring a fuse resistance, and the method includes steps as follows. A predetermined voltage value of a force voltage on a CGND bus electrically connected to at least one fuse element, a first current value of a measured current through the CGND bus in a first condition, and a second current value of another measured current through the CGND bus in a second condition are preloaded. The second current value is subtracted from the first current value, so as to get a subtracted current value, thereby removing a value of a leakage current through the CGND bus. The predetermined voltage value is divided by the subtracted current value to equal the fuse resistance of the at least one fuse element.

Yet another embodiment of the present disclosure is related to a non-transitory computer readable medium to store a plurality of instructions for commanding a computer to execute a method of measuring a fuse resistance, and the method includes steps as follows. A predetermined voltage value of a force voltage on a CGND bus electrically connected to at least one fuse element, a first current value of a measured current through the CGND bus in a first condition, and a second current value of another measured current through the CGND bus in a second condition are preloaded. The second current value is subtracted from the first current value, so as to get a subtracted current value, thereby removing a value of a leakage current through the CGND bus. The predetermined voltage value is divided by the subtracted current value to equal the fuse resistance of the at least one fuse element.

Many of the attendant features will be more readily appreciated, as the same becomes better understood by reference to the following detailed description considered in connection with the accompanying drawings.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
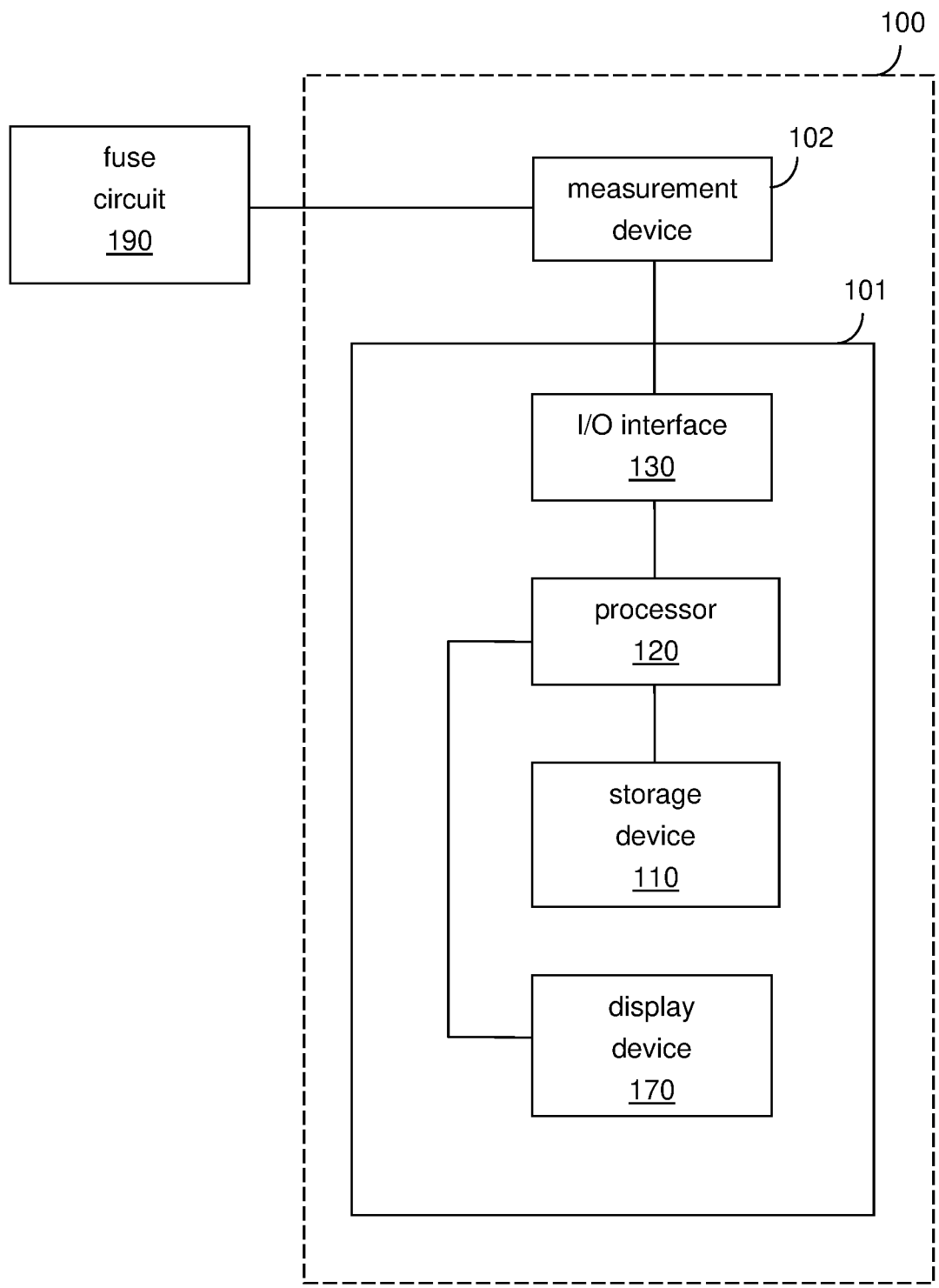
FIG. 1 is a block diagram of a system of measuring a fuse resistance according to some embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

Referring to FIG. 1. In one aspect, the present disclosure is directed to a system 100 of measuring a fuse resistance. This system may be easily integrated into a testing line and may be applicable or readily adaptable to all technologies. Herewith the system 100 of measuring the fuse resistance is described below with FIGS. 1 and 2.

The subject disclosure provides the system 100 of measuring the fuse resistance in accordance with the subject technology. Various aspects of the present technology are described with reference to the drawings. In the following description, for purposes of explanation, numerous specific details are set forth in order to provide a thorough understanding of one or more aspects. It can be evident, however, that the present technology can be practiced without these specific details. In other instances, well-known structures and devices are shown in block diagram form in order to facilitate describing these aspects. The word "exemplary" is used herein to mean "serving as an example, instance, or illustration." Any embodiment described herein as "exemplary" is not necessarily to be construed as preferred or advantageous over other embodiments.

FIG. 1 is a block diagram of the system 100 of measuring the fuse resistance according to some embodiments of the present disclosure. As shown in FIG. 1, the system 100 includes a computer 101 and a measurement device 102. In structure, for example, the computer 101 can be electrically connected to the measurement device 102. It should be noted that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. For example, the measurement device 102 may be a built-in measurement device that is directly connected to the computer 101, or the measurement device 102 may be an external measurement device, and the computer 101 indirectly gets data of the measurement device 102.

In practice, for example, the computer 101 can be a computer host or a computer server. The computer server can be remotely managed in a manner that provides accessibility, consistency, and efficiency. Remote management removes the need for input/output interfaces in the servers. An administrator can manage a large data centers containing numerous rack servers using a variety of remote management tools, such as simple terminal connections, remote desktop applications, and software tools used to configure, monitor, and troubleshoot server hardware and software. In practice, for example, the measurement device 102 can be a measurement circuit, test equipment, a testing device or the like.

As shown in FIG. 1, the system 100 includes a storage device 110, a processor 120, an I/O interface 130 and a display device 170. In practice, for example, the storage device 110 may be storage hardware, such as a hard disk drive (HDD) or a solid-state drive (SSD), the processor 120 may be a central processing unit (CPU), the I/O interface 130 may include a connector, communication equipment, transmission equipment, an input device or the like and the display device 170 may be a LCD or the like.

In structure, the processor 120 is electrically connected to the storage device 110, the I/O interface 130 and the display device 170. The I/O interface 130 can be connected to the measurement device 102. The measurement device 102 is electrically connected to a fuse circuit 190.

Figure 2A:
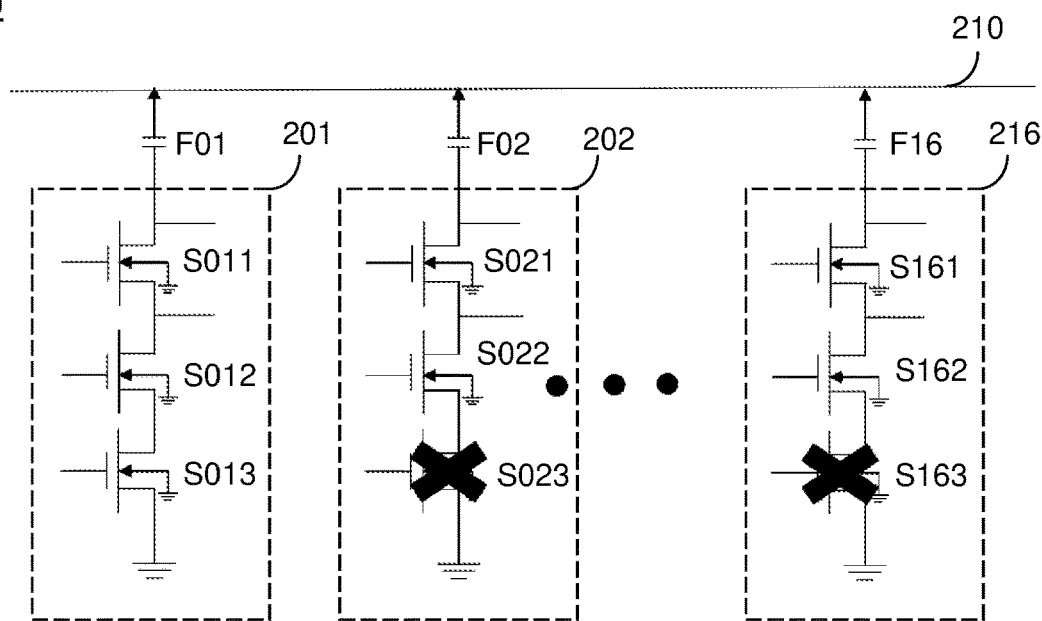
FIG. 2A is a schematic diagram of a status of a fuse circuit according to some embodiments of the present disclosure.
Figure 2B:
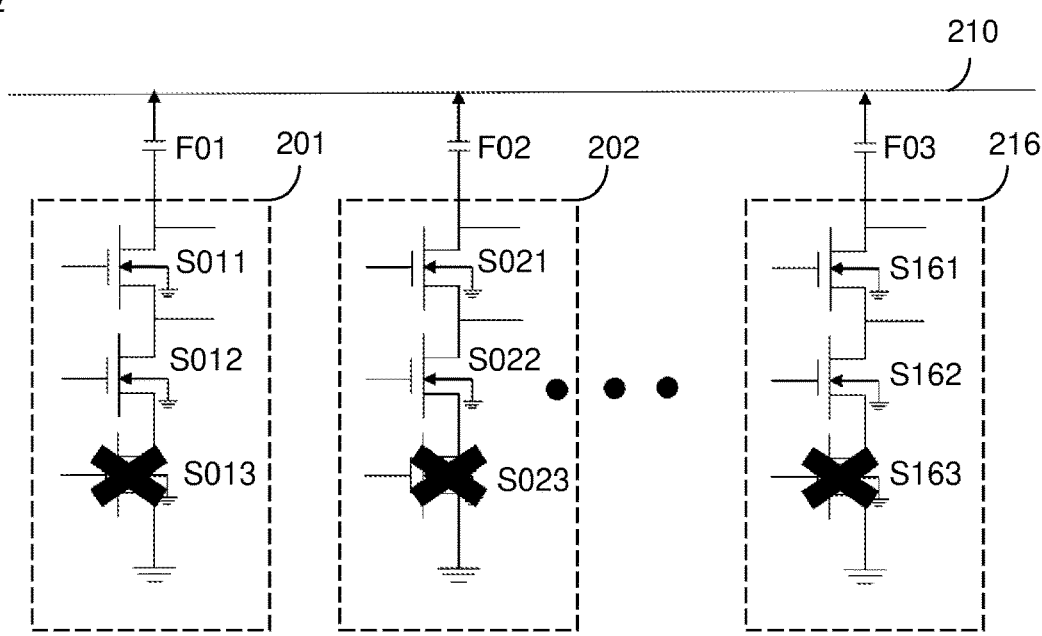
FIG. 2B is a schematic diagram of another status of the fuse circuit according to some embodiments of the present disclosure.

For a more complete understanding of the fuse circuit 190, referring FIG. 2A and FIG. 2B, FIG. 2A is a schematic diagram of a status of the fuse circuit 190 according to some embodiments of the present disclosure, and FIG. 2B is a schematic diagram of another status of the fuse circuit 190 according to some embodiments of the present disclosure.

As shown in FIG. 2A and FIG. 2B, the fuse circuit includes a common ground (CGND) bus 210, fuse elements F01, F02, ..., F16 and transistor units 201, 202, ..., 216. In structure, the CGND bus 210 is electrically connected to the fuse elements F01, F02, ..., F16, and the fuse elements F01, F02, ..., F16 are electrically connected to the transistor units 201, 202, ..., 216 respectively.

In some embodiments of the present disclosure, each of the transistor units 201, 202, ..., 216 includes one or more transistors connected in series. As shown in FIG. 2A and FIG. 2B, the transistor units 201 includes transistors S011, S012 and S013 connected in series, the transistor units 202 includes transistors S021, S022 and S023 connected in series, and the transistor units 216 includes transistors S161, S162 and S163 connected in series.

In practice, for example, each of the fuse elements F01, F02, ..., F16 can be an antifuse or a fuse. The antifuse is an electrical device that performs the opposite function to the fuse. Whereas a fuse starts with a low resistance and is designed to permanently break an electrically conductive path (typically when the current through the path exceeds a specified limit), an antifuse starts with a high resistance, and programming it converts it into a permanent electrically conductive path (typically when the voltage across the antifuse exceeds a certain level).

In an idle state, the CGND bus 210 is typically at 0V, or ground, and no current flows through the fuse elements F01, F02, ..., F16.

In practice, for example, during unpredictable process difference or inconsiderate design, there might have some leakage paths on the CGND bus 210. Once there has leakage current on the CGND bus 210, in a control experiment, it is difficult to get a correct value of the fuse resistance by using a simple manner of forcing one voltage to the CGND bus 210 and measuring one current from the CGND bus 210.

Referring FIG. 1, FIG. 2A and FIG. 2B, the system 100 can measure the fuse resistance correctly. In use, the storage device 110 is configured to store a predetermined voltage value of a force voltage (e.g., about 5V) on the CGND bus 210 electrically connected to at least one fuse element, a first current value of a measured current through the CGND bus 210 in a first condition, a second current value of another measured current through the CGND bus 210 in a second condition, and at least one instruction. The processor 120 is configured to access and execute the instruction for subtracting the second current value from the first current value, so as to get a subtracted current value, thereby removing a value of a leakage current through the CGND bus 210. Then, the processor 120 is configured to access and execute the instruction for dividing the predetermined voltage value by the subtracted current value to equal the fuse resistance of the at least one fuse element. The display device 170 can display the fuse resistance of the at least one fuse element.

In some embodiment, the at least one fuse element can includes any of the fuse elements F01, F02, ..., F16. In practice, for example, when the fuse element F01 is selected as a selected fuse element F01 to be measured, the transistor unit 201 is selected as a transistor unit 201 that is electrically connected to a selected fuse element F01.

For the fuse resistance of the selected fuse element F01, in a first embodiment, the measurement device 102 is configured to apply various voltages to the CGND bus 210 progressively when turning on a selected transistor unit 201 and turning off remaining transistor units 202, ..., 216 (shown in FIG. 2A), so as to measure various current values of various measured currents related to the various voltages from the fuse circuit 190.

In the first embodiment, the storage device 110 stores the various current values related to the various voltages. The processor 120 accesses and executes the at least one instruction for setting the first condition indicating that the selected transistor unit 201 operates in a linear region and the remaining transistor units 202, ..., 216 are turned off while a first voltage (e.g., about 5.5 V) of the various voltages is applied to the CGND bus 210, and setting the second condition indicating that the selected transistor unit 201 operates in the linear region and the remaining transistor units 202, . . . , 216 are turned off while a second voltage (e.g., about 0.5 V) of the various voltages is applied to the CGND bus 210, and the second voltage (e.g., about 0.5 V) is subtracted from the first voltage (e.g., about 5.5 V) to equal the predetermined voltage value (e.g., about 5V).

Then, in the first embodiment, the processor 120 accesses and executes the at least one instruction for choosing the first current value and the second current value from the various current values related to the various voltages according to the first condition and the second condition before subtracting the second current value from the first current value.

Then, in the first embodiment, the processor 120 accesses and executes the at least one instruction for subtracting the second current value from the first current value, so as to get the subtracted current value, thereby removing the value of the leakage current through the CGND bus 210.

Then, in the first embodiment, the processor 120 accesses and executes the at least one instruction for dividing the predetermined voltage value by the subtracted current value to equal the fuse resistance of the selected fuse element F01. The display device 170 can display the fuse resistance of the selected fuse element F01.

Alternatively, for the fuse resistance of the selected fuse element F01, in a second embodiment, the processor 120 accesses and executes the at least one instruction for setting the first condition indicating that the selected transistor unit 201 operates in the linear region and remaining transistor units 202, . . . , 216 are turned off while the force voltage (e.g., about 5 V) is applied to the CGND bus 210, and setting the second condition indicating that the transistor units 201, . . . , 216 are turned off totally while the force voltage (e.g., about 5 V) is applied to the CGND bus 210.

In the second embodiment, the measurement device 102 is configured to apply the force voltage (e.g., about 5 V) to the CGND bus 210 when turning on the selected transistor unit 201 and turning off the remaining transistor units 202, . . . , 216 (shown in FIG. 2A), so as to measure the first current value of the measured current from the fuse circuit 190, and the measurement device 102 is also configured to apply the same force voltage (e.g., about 5 V) to the CGND bus 210 when turning off the transistor units totally 201, . . . , 216 (shown in FIG. 2B), so as to measure the second current value of the another measured current from the fuse circuit 190.

After the first current value and the second current value are measured through the measurement device 102, in the second embodiment, the processor 120 accesses and executes the at least one instruction for subtracting the second current value from the first current value, so as to get the subtracted current value, thereby removing the value of the leakage current through the CGND bus 210.

Then, in the second embodiment, the processor 120 accesses and executes the at least one instruction for dividing the predetermined voltage value (e.g., about 5 V) by the subtracted current value to equal the fuse resistance of the selected fuse element F01. The display device 170 can display the fuse resistance of the selected fuse element F01.

Figure 3:
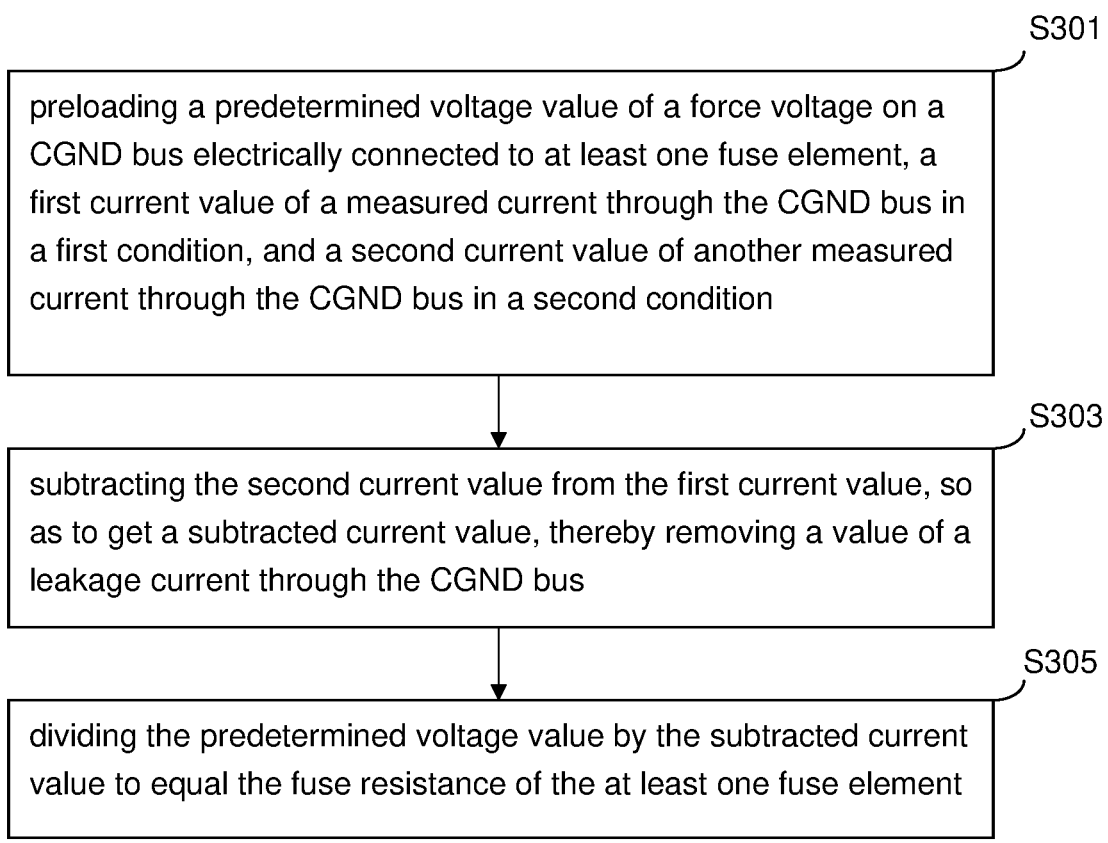
FIG. 3 is a flow chart of a method of measuring the fuse resistance according to some embodiments of the present disclosure.

For a more complete understanding of a method performed by the system 100, referring FIGS. 1-3, FIG. 3 is a flow chart of the method 300 of measuring the fuse resistance according to an embodiment of the present disclosure. As shown in FIG. 3, the method 300 includes operations S301, S303 and S305. However, as could be appreciated by persons having ordinary skill in the art, for the steps described in the present embodiment, the sequence in which these steps is performed, unless explicitly stated otherwise, can be altered depending on actual needs; in certain cases, all or some of these steps can be performed concurrently.

The method 300 may take the form of a computer program product on a computer-readable storage medium having computer-readable instructions embodied in the medium. Any suitable storage medium may be used including non-fuse circuit such as read only memory (ROM), programmable read only memory (PROM), erasable programmable read only memory (EPROM), and electrically erasable programmable read only memory (EEPROM) devices; fuse circuit such as SRAM, DRAM, and DDR-RAM; optical storage devices such as CD-ROMs and DVD-ROMs; and magnetic storage devices such as hard disk drives and floppy disk drives.

In operation S301, a predetermined voltage value of a force voltage (e.g., 5V) on the CGND bus 210 electrically connected to at least one fuse element, a first current value of a measured current through the CGND bus 210 in a first condition, and a second current value of another measured current through the CGND bus 210 in a second condition are preloaded. In operation S303, the second current value is subtracted from the first current value, so as to get a subtracted current value, thereby removing a value of a leakage current through the CGND bus 210. In operation S305, the predetermined voltage value is divided by the subtracted current value to equal the fuse resistance of the at least one fuse element.

In the method 300, the above-mentioned at least one fuse element can includes any of the fuse elements F01, F02, . . . , F16. In practice, for example, when the fuse element F01 is selected as a selected fuse element F01 to be measured, the transistor unit 201 is selected as a transistor unit 201 that is electrically connected to a selected fuse element F01.

For the fuse resistance of the selected fuse element F01, in a first embodiment, the method 300 includes steps of apply various voltages to the CGND bus 210 progressively through the measurement device 102 when turning on a selected transistor unit 201 and turning off remaining transistor units 202, . . . , 216 (shown in FIG. 2A), so as to measure various current values of various measured currents related to the various voltages from the fuse circuit 190.

In the first embodiment, the storage device 110 stores the various current values related to the various voltages. The method 300 includes steps of setting the first condition indicating that the selected transistor unit 201 operates in a linear region and the remaining transistor units 202, . . . , 216 are turned off while a first voltage (e.g., about 5.5 V) of the various voltages is applied to the CGND bus 210, and setting the second condition indicating that the selected transistor unit 201 operates in the linear region and the remaining transistor units 202, . . . , 216 are turned off while a second voltage (e.g., about 0.5 V) of the various voltages is applied to the CGND bus 210, and the second voltage (e.g., about 0.5 V) is subtracted from the first voltage (e.g., about 5.5 V) to equal the predetermined voltage value (e.g., about 5 V).

Then, in the first embodiment, the method 300 includes steps of choosing the first current value and the second current value from the various current values related to the various voltages according to the first condition and the second condition before operation S303.

In the first embodiment, operation S305 includes steps of dividing the predetermined voltage value by the subtracted current value to equal the fuse resistance of the selected fuse element F01.

Alternatively, for the fuse resistance of the selected fuse element F01, in a second embodiment, the method 300 includes steps of setting the first condition indicating that the selected transistor unit 201 operates in the linear region and remaining transistor units 202, . . . , 216 are turned off while the force voltage (e.g., about 5 V) is applied to the CGND bus 210, and setting the second condition indicating that the transistor units 201, . . . , 216 are turned off totally while the force voltage (e.g., about 5 V) is applied to the CGND bus 210.

In the second embodiment, the method 300 includes steps of applying the force voltage (e.g., about 5 V) to the CGND bus 210 through the measurement device 102 when turning on the selected transistor unit 201 and turning off the remaining transistor units 202, . . . , 216 (shown in FIG. 2A), so as to measure the first current value of the measured current from the fuse circuit 190. In addition, the method 300 also includes steps of applying the same force voltage (e.g., about 5V) to the CGND bus 210 through the measurement device 102 when turning off the transistor units totally 201, . . . , 216 (shown in FIG. 2B), so as to measure the second current value of the another measured current from the fuse circuit 190.

In the second embodiment, operation S305 includes steps of dividing the predetermined voltage value (e.g., about 5 V) by the subtracted current value to equal the fuse resistance of the selected fuse element F01.

In view of the above, according to the present disclosure, the system 100 and method 300 can prevent fuse resistance mismatching and can be implemented into the testing line.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A system of measuring a fuse resistance, and the system comprising:
a storage device configured to store a predetermined voltage value of a force voltage on a common ground (CGND) bus electrically connected to at least one fuse element, a first current value of a measured current through the CGND bus in a first condition, a second current value of another measured current through the CGND bus in a second condition, and at least one instruction; and
a processor electrically connected to the storage device and configured to access and execute the at least one instruction for:
setting the first condition indicating that a selected transistor unit of a plurality of transistor units operates in a linear region and remaining transistor units of the transistor units are turned off while the force voltage is applied to the CGND bus; and
setting the second condition indicating that the transistor units are turned off totally while the force voltage is applied to the CGND bus.

2. The system of claim 1, wherein the at least one fuse element comprises a plurality of fuse elements electrically connected to the CGND bus, the fuse elements are electrically connected to the transistor units respectively.

3. The system of claim 2, wherein each of the transistor units comprises one or more transistors connected in series.

4. The system of claim 2, further comprising:
a measurement device electrically connected to a fuse circuit comprising the CGND bus, the fuse elements and the transistor units, and the measurement device configured to apply various voltages to the CGND bus progressively when turning on a selected transistor unit of the transistor units and turning off remaining transistor units of the transistor units, so as to measure various current values of various measured currents related to the various voltages from the fuse circuit.

5. The system of claim 4, wherein the selected transistor unit is electrically connected to a selected fuse element of the fuse elements.

6. The system of claim 5, wherein the storage device stores the various current values related to the various voltages, and the processor accesses and executes the at least one instruction for:
setting the first condition indicating that the selected transistor unit operates in a linear region and the remaining transistor units are turned off while a first voltage of the various voltages is applied to the CGND bus.

7. The system of claim 6, wherein the processor accesses and executes the at least one instruction for:
setting the second condition indicating that the selected transistor unit operates in the linear region and the remaining transistor units are turned off while a second voltage of the various voltages is applied to the CGND bus, and the second voltage is subtracted from the first voltage to equal the predetermined voltage value; and
choosing the first current value and the second current value from the various current values related to the various voltages according to the first condition and the second condition before subtracting the second current value from the first current value.

8. The system of claim 2, wherein the processor accesses and executes the at least one instruction for:
subtracting the second current value from the first current value, so as to get a subtracted current value, thereby removing a value of a leakage current through the CGND bus.

9. The system of claim 2, further comprising:
a measurement device electrically connected to a fuse circuit comprising the CGND bus, the fuse elements and the transistor units, and the measurement device configured to apply the force voltage to the CGND bus when turning on the selected transistor unit and turning off the remaining transistor units, so as to measure the first current value of the measured current from the fuse circuit, and the measurement device further configured to apply the force voltage to the CGND bus when turning off the transistor units totally, so as to measure the second current value of the another measured current from the fuse circuit.

10. The system of claim 9, wherein the selected transistor unit is electrically connected to a selected fuse element of the fuse elements.

11. A method of measuring a fuse resistance, and the method comprising steps of:
preloading a predetermined voltage value of a force voltage on a CGND bus electrically connected to at least one fuse element, a first current value of a measured current through the CGND bus in a first condition, a second current value of another measured current through the CGND bus in a second condition, and at least one instruction,
wherein the at least one fuse element comprises a plurality of fuse elements electrically connected to the CGND bus, the fuse elements are electrically connected to a plurality of transistor units respectively, each of the transistor units comprises one or more transistors connected in series, a fuse circuit comprising the CGND bus, the fuse elements and the transistor units, and the method further comprises:

setting the first condition indicating that a selected transistor unit of the transistor units operates in a linear region and remaining transistor units of the transistor units are turned off while the force voltage is applied to the CGND bus; and setting the second condition indicating that the transistor units are turned off totally while the force voltage is applied to the CGND bus.

12. The method of claim 11, further comprising:
applying various voltages to the CGND bus progressively through a measurement device when turning on the selected transistor unit of the transistor units and turning off the remaining transistor units of the transistor units, so as to measure various current values of various measured currents related to the various voltages from the fuse circuit, wherein the selected transistor unit is electrically connected to a selected fuse element of the fuse elements.

13. The method of claim 12, further comprising:
setting the first condition indicating that the selected transistor unit operates in a linear region and the remaining transistor units are turned off while a first voltage of the various voltages is applied to the CGND bus.

14. The method of claim 13, further comprising:
setting the second condition indicating that the selected transistor unit operates in the linear region and the remaining transistor units are turned off while a second voltage of the various voltages is applied to the CGND bus, and the second voltage is subtracted from the first voltage to equal the predetermined voltage value; and
choosing the first current value and the second current value from the various current values related to the various voltages according to the first condition and the second condition before subtracting the second current value from the first current value.

15. The method of claim 11, further comprising:
applying the force voltage to the CGND bus through a measurement device when turning on the selected transistor unit and turning off the remaining transistor units, so as to measure the first current value of the measured current from the fuse circuit; and
applying the force voltage to the CGND bus through the measurement device when turning off the transistor units totally, so as to measure the second current value of the another measured current from the fuse circuit, wherein the selected transistor unit is electrically connected to a selected fuse element of the fuse elements.

16. A non-transitory computer readable medium to store a plurality of instructions for commanding a computer to execute a method of measuring a fuse resistance, and the method comprising steps of:
preloading a predetermined voltage value of a force voltage on a CGND bus electrically connected to at least one fuse element, a first current value of a measured current through the CGND bus in a first condition, a second current value of another measured current through the CGND bus in a second condition, and at least one instruction;

setting the first condition indicating that a selected transistor unit operates in a linear region and remaining transistor units are turned off while a first voltage of various voltages is applied to the CGND bus; and setting the second condition indicating that the selected transistor unit operates in the linear region and the remaining transistor units are turned off while a second voltage of the various voltages is applied to the CGND bus, and the second voltage is subtracted from the first voltage to equal the predetermined voltage value.

17. The non-transitory computer readable medium of claim 16, wherein the at least one fuse element comprises a plurality of fuse elements electrically connected to the CGND bus, the fuse elements are electrically connected to a plurality of transistor units respectively, each of the transistor units comprises one or more transistors connected in series, a fuse circuit comprising the CGND bus, the fuse elements and the transistor units, and the method further comprises:

applying the various voltages to the CGND bus progressively through a measurement device when turning on the selected transistor unit of the transistor units and turning off the remaining transistor units of the transistor units, so as to measure various current values of various measured currents related to the various voltages from the fuse circuit, wherein the selected transistor unit is electrically connected to a selected fuse element of the fuse elements.

18. The non-transitory computer readable medium of claim 16, wherein the method further comprises:
choosing the first current value and the second current value from various current values related to the various voltages according to the first condition and the second condition before subtracting the second current value from the first current value.

19. The non-transitory computer readable medium of claim 16, wherein the at least one fuse element comprises a plurality of fuse elements electrically connected to the CGND bus, the fuse elements are electrically connected to a plurality of transistor units respectively, each of the transistor units comprises one or more transistors connected in series, a fuse circuit comprising the CGND bus, the fuse elements and the transistor units, and the method further comprises:

setting the first condition indicating that a selected transistor unit of the transistor units operates in a linear region and remaining transistor units of the transistor units are turned off while the force voltage is applied to the CGND bus; and setting the second condition indicating that the transistor units are turned off totally while the force voltage is applied to the CGND bus.

20. The non-transitory computer readable medium of claim 19, wherein the method further comprises:
applying the force voltage to the CGND bus through a measurement device when turning on the selected transistor unit and turning off the remaining transistor units, so as to measure the first current value of the measured current from the fuse circuit; and
applying the force voltage to the CGND bus through the measurement device when turning off the transistor units totally, so as to measure the second current value of the another measured current from the fuse circuit, wherein the selected transistor unit is electrically connected to a selected fuse element of the fuse elements.

* * * * *